United States Patent
Ball et al.

(10) Patent No.: US 8,217,706 B2
(45) Date of Patent: Jul. 10, 2012

(54) METHOD FOR REGULATING TEMPERATURE

(75) Inventors: Alan R. Ball, Gilbert, AZ (US); Stephen P. Robb, Fountain Hills, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 18 days.

(21) Appl. No.: 12/397,444

(22) Filed: Mar. 4, 2009

(65) Prior Publication Data

US 2009/0160528 A1    Jun. 25, 2009

(51) Int. Cl.
*H01L 35/00* (2006.01)
(52) U.S. Cl. .................... 327/512; 361/103; 327/513
(58) Field of Classification Search .............. 327/512, 327/513; 361/103
See application file for complete search history.

(56) References Cited

U.S. PATENT DOCUMENTS

| | | | | |
|---|---|---|---|---|
| 4,896,245 A * | 1/1990 | Qualich | ................. | 361/103 |
| 5,394,419 A * | 2/1995 | Neuhaus et al. | ......... | 372/29.014 |
| 5,497,285 A * | 3/1996 | Nadd | ................. | 361/103 |
| 6,055,149 A * | 4/2000 | Gillberg et al. | ......... | 361/103 |
| 6,437,704 B1 * | 8/2002 | Nodinger | ........ | 340/815.4 |
| 6,914,831 B2 * | 7/2005 | Di Iorio | ............ | 365/189.09 |
| 7,214,910 B2 | 5/2007 | Chen et al. | | |
| 7,332,358 B2 * | 2/2008 | Orr | .................. | 438/10 |
| 2004/0070910 A1 * | 4/2004 | Gergintschew | ......... | 361/103 |
| 2005/0285662 A1 * | 12/2005 | Furuta et al. | ......... | 327/512 |
| 2006/0061339 A1 * | 3/2006 | Lewis et al. | ............ | 323/237 |
| 2007/0200608 A1 * | 8/2007 | Fang et al. | ............. | 327/261 |
| 2007/0273447 A1 * | 11/2007 | Yamamoto et al. | ........ | 330/296 |

FOREIGN PATENT DOCUMENTS

WO    2004/091067 A1    10/2004

* cited by examiner

*Primary Examiner* — Lincoln Donovan
*Assistant Examiner* — Ryan Jager
(74) *Attorney, Agent, or Firm* — Rennie William Dover

(57) ABSTRACT

A method and circuit for managing thermal performance of an integrated circuit. Temperature sensing circuits and a plurality of power FETs that are coupled together in parallel are manufactured from a semiconductor substrate. Each temperature sensing circuit monitors the temperature of the portion of the semiconductor substrate near or including a corresponding power FET. When the temperature of the semiconductor substrate near one or more of the power FETs reaches a predetermined value, the corresponding temperature sensing circuit reduces a voltage appearing on the gate of the power FET. The reduced voltage increases the on-resistance of the power FET and channels a portion of its current to others of the plurality of power FETs. The power FET continues operating but with a reduced current flow. When the temperature of the semiconductor substrate falls below the predetermined value, the gate voltage of the power FET is increased to its nominal value.

21 Claims, 4 Drawing Sheets

METHOD FOR REGULATING TEMPERATURE

The present application is based on prior U.S. patent application Ser. No. 11/171,018 filed on Jul. 1, 2005 which is hereby incorporated herein by reference in its entirety, and priority thereto for common subject matter is hereby claimed.

FIELD OF THE INVENTION

The present invention relates, in general, to semiconductor components and, more particularly, to thermal management in semiconductor components.

BACKGROUND OF THE INVENTION

High power semiconductor components typically include circuitry to protect them from thermal failure. For example, an integrated voltage regulator that dissipates a large amount of heat often includes a thermal shutdown circuit that shuts down or turns off the integrated circuit when the temperature reaches a critical level. Once the substrate cools down, the thermal shutdown circuit turns the voltage regulator back on. A drawback with including thermal shutdown circuits is that they degrade the switching speed of semiconductor components such as discrete semiconductor devices.

Another common way to protect power Metal Oxide Semiconductor Field Effect Transistors (MOSFETs) against thermal failure is to decrease the current conducted through them by coupling together a plurality of output devices in parallel. For example, a plurality of insulated gate field effect transistors can be configured to have their drain terminals coupled to each other and their source terminals coupled to each other. In this configuration, the output current is shared by several insulated gate field effect transistors such that the total output current is the sum of the currents flowing through each insulated gate field effect transistor. A drawback with this approach is that differences in their on-resistance ($R_{dson}$) may lead to an imbalance in the currents that flow through each insulated gate field effect transistor causing one or more of the field effect transistors to overheat and suffer thermal failure. Integrated circuit manufacturers have included active circuits that measure the current flowing in the parallel connected insulated gate field effect transistors to overcome this problem. A control circuit uses the measured current to adjust the gate drive of the individual insulated gate field effect transistors to maintain substantially the same current in each insulated gate field effect transistor. Drawbacks with this approach include the need for complicated circuitry to monitor the current flowing through each insulated gate field effect transistor and the complexity of the interconnections to route the data to the control circuit.

Hence, what is needed is a method and semiconductor device for promoting current sharing when the on-resistances of parallel connected semiconductor devices are not closely matched. It would be advantageous for the method and semiconductor device to be cost efficient and reliable.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Figure 1:
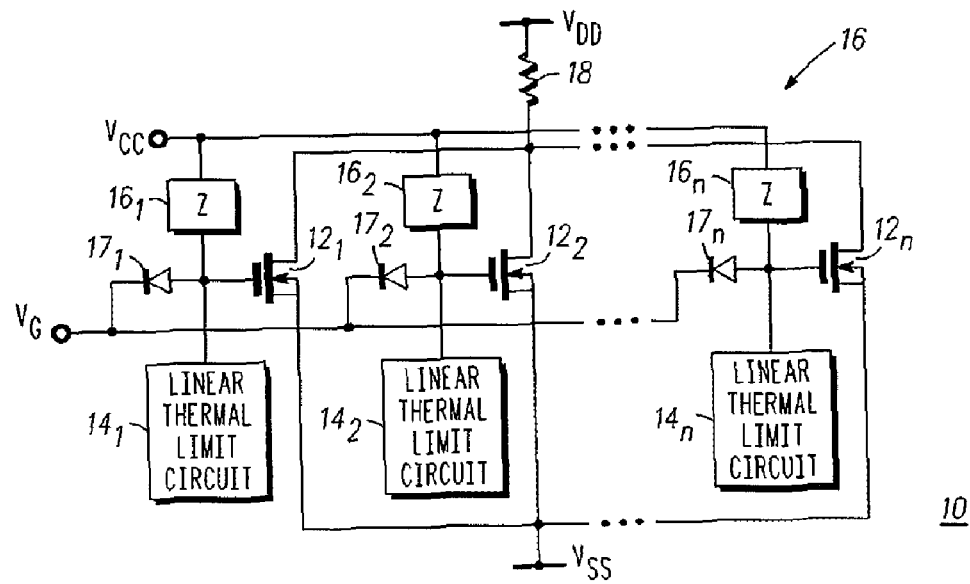
FIG. 1 is a block circuit diagram of a power FET network in accordance with an embodiment of the present invention.

Generally the present invention provides methods and circuitry for performing thermal management in an integrated circuit manufactured from a semiconductor substrate. In accordance with one embodiment, the integrated circuit comprises a plurality of power Field Effect Transistors (FETs) connected in a parallel configuration. Each parallel connected power FET is connected to a linear thermal limit circuit. The integrated circuit is also referred to as a power FET network. The linear thermal limit circuit operates in an idle mode when the heat generated by the power is sufficiently low that the temperature of the semiconductor substrate is below a predetermined value or level. The predetermined temperature value or level is also referred to as a predefined temperature, a threshold temperature value or level, or a threshold value or level. When one or more of the power FETs generate sufficient heat to raise the temperature of the semiconductor substrate to the predetermined level, the linear thermal limit circuit enters an active or regulating mode and lowers the current flowing in the power FET or the power FETs generating the excessive heat. The power FET network is configured such that the current flowing in the power FET network remains at a substantially constant level. Thus, lowering the current in one or more of the power FETs increases the current flowing in the other power FETs of the plurality of power FETs. Because the total current flowing in the power FET network is maintained at a substantially constant level, the power dissipated by the power FET network is maintained at a substantially constant level. An advantage of including the linear thermal limit circuit in accordance with the present invention is that the power FETs can be coupled in parallel without using complex and expensive circuitry.

In accordance with another embodiment, the present invention includes a multi-function pin that allows the power FET network to operate in one of three operating modes. In a first operating mode, the multi-function pin is coupled to a source of operating potential that is preferably at ground level. In this operating mode the linear thermal limit circuit operates in an idle mode when the temperature of the semiconductor substrate is below a predetermined level and controls the current in the power FETs when the temperature reaches the predetermined or threshold level in order to maintain a constant temperature. In a second operating mode, the multi-function pin is left floating or open, which causes the power FET network to latch into an "off-state" when the temperature of the semiconductor substrate reaches the predetermined level. In a third operating mode, the multi-function pin is coupled to the source of operating potential through a capacitor. In this mode, when the temperature of the semiconductor substrate reaches the predetermined or threshold level the power FET network latches into the "off-state" after a fixed or predetermined time delay. An advantage of this operating mode is that the power FET network continues operating for a programmed or predetermined period of time after the temperature reaches the threshold level, thereby permitting the power FET network to continue normal operation in case the increased temperature was caused by a transient thermal event.

In accordance with another embodiment, the present invention includes a high speed switching circuit suitable for use in applications having switching frequencies greater than about 100 kiloHertz. The high speed switching circuit comprises a gate drive circuit coupled to the gate of a power FET. When the temperature of the semiconductor substrate near the power FET reaches a predetermined level, a thermal sense circuit lowers the power supply voltage to the gate drive circuit which lowers the amplitude of the output signal from the gate drive circuit. In other words, lowering the supply voltage to the gate drive circuit lowers the output signal of the drive circuit, i.e., the gate drive voltage to the power FET, which lowers the current flowing through the power FET and decreases the heat generated by the power FET. Once the temperature of the semiconductor material near the power FET is decreased to a safe operating level, the thermal sense circuit restores the gate drive circuit power supply voltage to its nominal operating level which increases the gate drive signal to the power FET.

FIG. 1 is a block circuit diagram of a power FET network 10 comprising a plurality of power Metal Oxide Semiconductor Field Effect Transistors (MOSFETs) $12_1$-$12_n$, a plurality of linear thermal limit circuits $14_1$-$14_n$, a plurality of gate impedances $16_1$-$16_n$, and a plurality of Oring diodes $17_1$-$17_n$. As those skilled in the art are aware, an impedance is generally denoted by the letter "Z." It should be noted that a MOSFET is also referred to as an insulated gate semiconductor device, an insulated gate field effect transistor, a semiconductor device, or a field effect transistor (FET). The term field effect transistor (FET) can also refer to field effect transistors in general, e.g., a junction field effect transistor, etc. Each power FET $12_1$-$12_n$ has a gate terminal, a drain terminal, and a source terminal, and each linear thermal limit circuit $14_1$-$14_n$ has a control output terminal. The power FETs are coupled in a parallel configuration, thus the drain terminals of each power FET are connected together, i.e., they are commonly connected, and the source terminals of each power FET are connected together, i.e., they are commonly connected. The commonly connected drain terminals are coupled for receiving a source of operating potential $V_{DD}$ through a load impedance 18 and the commonly connected source terminals are coupled for receiving a source of operating potential $V_{SS}$. The gate terminals of each power FET are connected to a corresponding linear thermal limit circuit $14_1$-$14_n$ and for receiving a source of operating potential $V_{CC}$ through a corresponding gate impedance $16_1$-$16_n$ and to an anode of a corresponding Oring diode $17_1$-$17_n$. The cathodes of each corresponding Oring diode $17_1$-$17_n$ are connected together and for receiving a gate control signal $V_G$.

By way of example, $V_{DD}$ ranges from about 20 volts to about 600 volts, $V_{SS}$ is set at ground potential, and $V_{CC}$ ranges from about 1 volt to about 15 volts.

The number of power FETs that can that can be coupled in parallel is not a limitation of the present invention. Preferably, however, ten or fewer power FETs are coupled in parallel. Accordingly, FIG. 1 illustrates power FETs $12_1$-$12_n$ having their drain terminals commonly connected together and for receiving source of operating potential $V_{DD}$ and their source terminals commonly connected together and for receiving source of operating potential $V_{SS}$. It should be understood that the subscript "n" has been appended to reference number 12 to indicate that there may be a single power FET or a plurality of power FETs coupled in parallel. Thus, power FET $12_n$ is shown as being coupled to power FET $12_2$ using ellipses to indicate that there may be zero or more power FETs 12 coupled to power FET $12_1$. The source terminals of power FETs $12_1$-$12_n$ are also coupled to their bodies, i.e., to the substrates from which power FETs $12_1$-$12_n$ are formed.

Like power FETs $12_n$, the subscript "n" has been appended to the reference numbers of the linear thermal limit circuits, the gate impedances, and the ORing diodes to indicate that there can be one or more of each of them. The gate terminal of power FET $12_1$ is coupled to the output terminal of linear thermal limit circuit $14_1$, the anode of Oring diode $17_1$, and for receiving source of operating potential $V_{CC}$ through gate impedance $16_1$. Similarly, the gate terminals of power FETs $12_2$-$12_n$ are coupled to the output terminals of linear thermal limit circuits $14_2$-$14_n$ and to the anodes of Oring diodes $17_2$-$17_n$, respectively, and for receiving source of operating potential $V_{CC}$ through gate impedances $16_2$-$16_n$, respectively.

In operation, linear thermal limit circuits $14_1$-$14_n$ monitor the temperatures in the substrate material adjacent to or containing power FETs $12_1$-$12_n$ respectively. If the temperature of one of the power FETs reaches a predetermined value or level, the linear thermal limit circuit associated with that power FET decreases the gate voltage of the power FET to lower the current flowing through it. Because the current entering the plurality of power FETs $12_1$-$12_n$ substantially equals the current leaving the plurality of power FETs $12_1$-$12_n$ the current flowing through the power FETs whose gate voltages have not been reduced increases to compensate for the decreased current flowing through the one or more power FETs whose gate voltages have been reduced. For example, if the temperature of the semiconductor substrate near power FET $12_1$ exceeds the predetermined value, linear thermal limit circuit $14_1$ lowers the gate voltage on the gate of power FET $12_1$. This reduces the conductance of power FET $12_1$ and decreases the current flowing through power FET $12_1$. In other words, the on-resistance of power FET $12_1$, is increased. Because of the increased on-resistance the current that would have flowed through power FET $12_1$ is channeled toward power FETs $12_2$-$12_n$. Thus, the current flowing through power FET $12_1$ is reduced independently of the current flowing through power FETs $12_2$-$12_n$. The reduced current increases the on-resistance of power FET $12_1$. In addition, lowering the gate voltage on the gate of power FET $12_1$ lowers the voltage at the anode of diode $17_1$ which reverse biases diode $17_1$ and electrically isolates power FET $12_1$ from power FETs $12_2$-$12_n$. Diodes $17_1$-$17_n$ are referred to as ORing diodes because they perform a logical Oring function.

Once the temperature of the semiconductor substrate containing power FET $12_1$ falls below the predetermined value, linear current limit circuit $14_1$ raises the voltage at the gate of power FET $12_1$ thereby increasing current conduction through it. Thus, during operation the power dissipated by power FET $12_1$ remains substantially constant.

Figure 2:
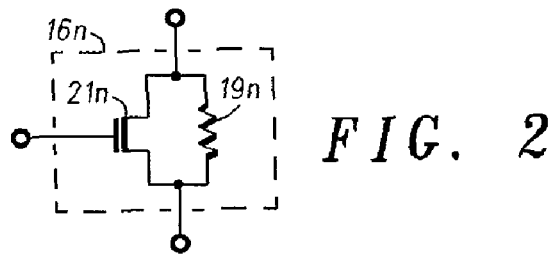
FIG. 2 is a circuit schematic of a portion of the power FET network of FIG. 1.

FIG. 2 illustrates gate impedance $16_n$ in accordance with an embodiment of the present invention. What is shown in FIG. 2 is a resistor $19_n$ coupled in parallel with an active device $21_n$. More particularly, the active device is a field effect transistor $21_n$ having a current carrying electrode connected to one terminal of resistor $19_n$ and another current carrying electrode connected to the other terminal of resistor $19_n$. A control electrode of field effect transistor $21_n$ is connected to thermal limit circuit $14_n$. Preferably, resistor $19_n$ has a resistance of at least about 1,000 Ohms. Configuring gate impedance $16_n$ as a resistor in parallel with an active device allows operation of gate impedance $16_n$ in two modes: a normal operating mode and a thermal protection operating mode. In the normal operating mode, current limit circuit $14_n$ biases field effect transistor $21_n$ in an active mode by placing a logic high gate control signal on its gate terminal. In this operating mode, field effect transistor $21_n$ functions as a low impedance element in parallel with the high impedance resistor $19_n$. Thus, gate impedance $16_n$ has an impedance value substantially equal to that of field effect transistor $21_n$. The low impedance path provides an increased bandwidth and allows power FET $12_n$ to be switched or turned off and on. In the thermal protection mode of operation, current limit circuit $14_n$ biases field effect transistor $21_n$ in an inactive operating mode by placing a logic low gate control signal on its gate terminal. In this operating mode, field effect transistor $21_n$ has an impedance substantially greater than that of resistor $19_n$. Thus, gate impedance $16_n$ has an impedance value substantially equal to that of resistor $19_n$. The high impedance path allows power FET $12_n$ to be turned off thereby preventing it from becoming thermally damaged, i.e., preventing the heat generated by power FET $12_n$ from damaging the semiconductor substrate from which power FET $12_n$ is formed. It should be understood that the type of semiconductor device for active element $21_n$ is not a limitation of the present invention. For example, active element $21_n$ can be a bipolar junction transistor, a junction field effect transistor, a metal insulator semiconductor device, or the like. Like power FETs $12_n$, linear thermal limit circuits $14_n$, gate impedances $16_n$, and Oring diodes $17_n$, the subscript "n" has been appended to the reference numbers of the high impedance resistors and the field effect transistors to indicate that there can be one or more of each of them In accordance with another embodiment, gate impedance $16_n$ is a two-terminal device that includes only resistor $19_n$, i.e., field effect transistor $21_n$ is not present. In this embodiment, resistor $19_n$ ensures that power FET $12_n$ turns off when a thermal spike occurs. When gate impedances $16_1$-$16_n$ are resistors, they are typically referred to as pull-up resistors.

Figure 3:
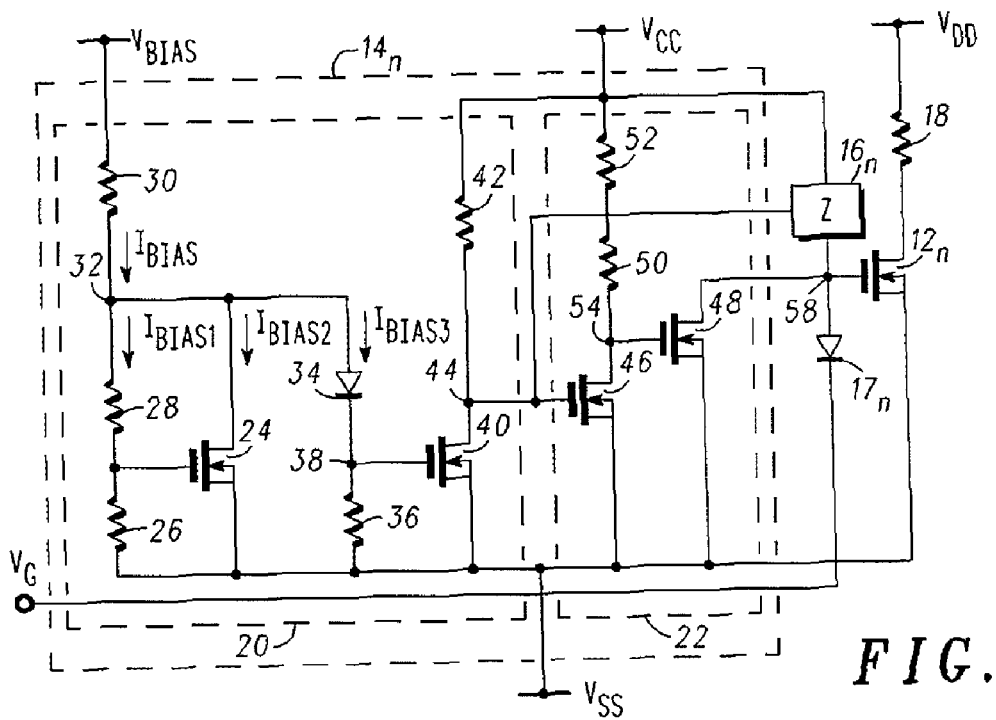
FIG. 3 is a circuit schematic of a power FET network in accordance with another embodiment of the present invention.

FIG. 3 illustrates a schematic diagram of power FET $12_n$ coupled to linear thermal limit circuit $14_n$, gate impedance $16_n$, and Oring diode $17_n$. In accordance with an embodiment of the present invention, linear thermal limit circuit $14_n$ comprises a thermal sense circuit 20 coupled to a thermal amplifier 22, wherein thermal sense circuit 20 and thermal amplifier 22 are formed in a semiconductor substrate or a portion of a semiconductor chip. Thermal sense circuit 20 comprises an N-channel transistor 24 having gate, drain, and source terminals. The gate terminal is coupled to source of operating potential $V_{SS}$ through a resistor 26 and to the drain terminal of N-channel transistor 24 through a resistor 28. The drain terminal is also coupled to a source of operating potential $V_{BIAS}$ through a resistor 30. By way of example, $V_{BIAS}$ is a voltage ranging from about 3 volts to about 15 volts. The drain terminal and one terminal of each resistor 28 and 30 form a common connection or node 32, which node 32 is also referred to as a biasing node. The source terminal is coupled for receiving source of operating potential $V_{SS}$. Resistors 26, 28, and 30 cooperate to form a bias network for thermal sense circuit 20. Thermal sense circuit 20 further includes a temperature sensing diode 34 having an anode connected to node 32 and a cathode coupled for receiving source of operating potential $V_{SS}$ through a resistor 36. Although only one temperature sensing diode 34 is shown, it should be understood that there may be a plurality of temperature sensing diodes coupled together in series, a plurality of temperature sensing diodes coupled in parallel, or combinations thereof. Although the temperature sensing element has been described as a temperature sensing diode, it should be noted that this is not a limitation of the present invention. Other suitable temperature sensing elements include temperature variable resistors, using FET threshold voltages, using on-resistances, or the like.

Thermal sense circuit 20 also includes an N-channel FET 40 having a gate terminal, a drain terminal coupled for receiving source of operating potential $V_{CC}$ through a resistor 42, and a source terminal coupled for receiving source of operating potential $V_{SS}$ and to the substrate from which N-channel FET 40 is formed. The common connection of the cathode of temperature sensing diode 34, one terminal of resistor 36, and the gate terminal of N-channel FET 40 form a node 38. The connection of the drain terminal and one terminal of resistor 42 forms an output node 44, which is connected to an input of thermal amplifier 22. N-channel FET 40 cooperates with resistor 36 to function as an operational amplifier with a reference potential coupled to one input, wherein the reference potential is the threshold voltage of N-channel FET 40 and node 38 serves as the other input. In other words, N-channel FET 40 cooperates with resistor 36 to form a temperature dependent voltage.

Thermal amplifier 22 comprises a pair of N-channel FETs 46 and 48 wherein each N-channel FET has a gate terminal, a drain terminal, and a source terminal. The gate terminal of N-channel FET 46 is connected to output node 44 of thermal sense circuit 20 and the source terminal of N-channel FET 46 is coupled for receiving source of operating potential $V_{SS}$ and to the substrate containing N-channel FET 46. The drain terminal of N-channel FET 46 is coupled for receiving source of operating potential $V_{CC}$ through series connected resistors 50 and 52 and to the gate terminal of N-channel FET 48. Although resistors 50 and 52 have been shown as a pair of series connected resistors, it should be understood that this is not a limitation of the present invention. For example, resistors 50 and 52 may be replaced by a single resistor. The common connection of the drain terminal of N-channel FET 46, the gate terminal of N-channel FET 48, and one terminal of resistor 50 forms a node 54. A gate of N-channel FET 48 is connected to node 54, a drain is coupled to source of operating potential $V_{CC}$ through an impedance $16_n$, and the source terminal of N-channel FET 48 is coupled for receiving source of operating potential $V_{SS}$. A node 58 is formed by the connection of the drain terminal of N-channel FET 48 and one terminal of impedance $16_n$ and serves as an output node of linear thermal limit circuit $14_n$. It should be noted that node 58 is also the output node of thermal amplifier 22.

In accordance the embodiment of FIG. 3, the gate terminal of power FET $12_n$ is connected to node 58 and the drain terminal of power FET 12 is coupled for receiving source of operating potential $V_{DD}$ through load impedance 18. The source terminal of power FET $12_n$ is coupled for receiving source of operating potential $V_{SS}$. This embodiment is also referred to as a low-side configuration.

In accordance with another embodiment, the gate terminal of power FET $12_n$ is connected to node 58 and the source terminal of power FET 12 is coupled for receiving source of operating potential $V_{SS}$ through load impedance 18. The drain terminal of power FET $12_n$ is coupled for receiving source of operating potential $V_{DD}$. This embodiment is also referred to as a high-side configuration.

In operation, bias voltage $V_{BIAS}$ cooperates with resistors 26, 28, and 30 to create a bias current, $I_{BIAS}$, for N-channel FET 40 and temperature sensing diode 34. At a temperature below a predetermined temperature, e.g., at a nominal operating temperature, a portion $I_{BIAS1}$ of current $I_{BIAS}$ flows through resistors 28 and 26, a portion $I_{BIAS2}$ of current $I_{BIAS}$ flows through N-Channel FET 24, and a portion $I_{BIAS\,3}$ of current $I_{BIAS}$ flows through temperature sensing diode 34. At the nominal operating temperature, the voltage at node 38 is sufficiently low that the gate-to-source voltage of N-channel FET 40 is below the transistor's threshold voltage, which transistor 40 is operating in an idle mode. Thus, N-channel FET 40 is in a non-conducting state and the voltage at output node 44 is approximately equal to the voltage delivered by source of operating potential $V_{CC}$. This voltage is amplified by amplifier 22 and appears at output node 58 to bias N-channel power FET $12_n$ so that it is in a forward operating mode, i.e., it is "on."

When the temperature of the semiconductor substrate containing N-channel power FET $12_n$ and temperature sensing diode 34 increases, the voltage drop across temperature sending diode 34 decreases. Because temperature sensing diode 34 and resistor 36 support a bias voltage set at node 32, the voltage drop across resistor 36 increases. Preferably, temperature sensing diode 34 is configured such that when the temperature in the semiconductor substrate reaches a predetermined value, the current conducted by temperature sensing diode 34 increases to such a level that the gate-to-source voltage of N-channel FET 40 becomes greater than the threshold voltage of N-channel FET 40 and it turns on, i.e., N-channel power FET 40 begins to conduct current. This decreases the voltage at node 44, which voltage is input into thermal amplifier 22. The voltage appearing at node 44 is amplified by thermal amplifier 22 and appears at node 58. The amplified voltage signal appearing at node 58 lowers the gate voltage appearing at the gate of N-channel power FET $12_n$, thereby decreasing the current flowing through N-channel power FET $12_n$. The reduced current flowing in N-channel power FET $12_n$ lowers the amount of power dissipated by N-channel power FET $12_n$, which results in a decrease in the temperature of the semiconductor substrate containing N-channel power FET $12_n$ and temperature sensing diode 34. Once the temperature of the semiconductor substrate falls below the predetermined value, the current conducted by temperature sensing diode 34 decreases such that the gate-to-source voltage of N-channel FET 40 is less than its threshold voltage. Thus, N-channel FET 40 returns to idle mode operation which restores the voltage appearing at node 58 and increases the amount of current flowing through N-channel power FET $12_n$.

Figure 4:
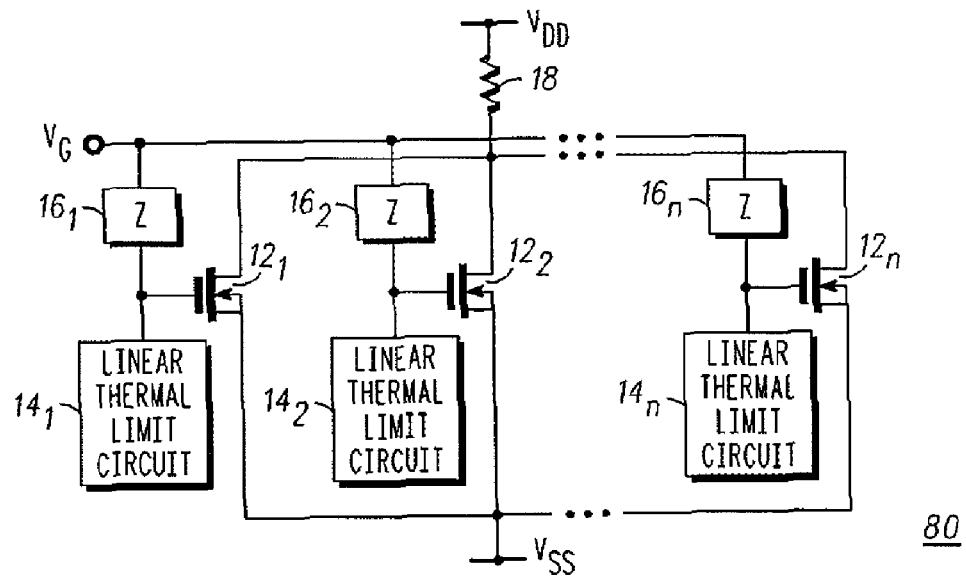
FIG. 4 is a block diagram of a power FET network in accordance with yet another embodiment of the present invention.

FIG. 4 is a block circuit diagram of a power FET network 80 comprising a plurality of power FETs $12_1$-$12_n$ a plurality of linear thermal limit circuits $114_1$-$114_n$, and a plurality of gate impedances $16_1$-$16_n$. The configuration of power FET network 80 is similar to that of power FET network 10 described with reference to FIG. 1. However, in power FET network 80 gate impedances $16_1$-$16_n$ are coupled for receiving gate voltage $V_G$, rather than source of operating potential $V_{CC}$, and O-ring diodes $17_1$-$17_n$ are not included.

Figure 5:
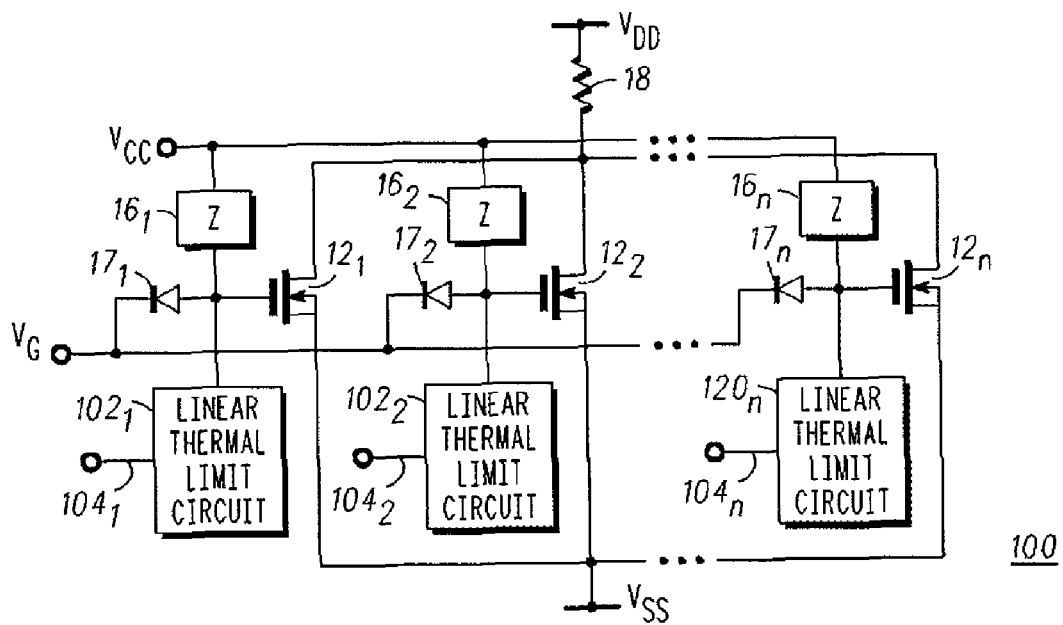
FIG. 5 is a block circuit diagram of a power FET network in accordance with yet another embodiment of the present invention.

FIG. 5 is a block circuit diagram of a power FET network 100 comprising a plurality of power FETs $12_1$-$12_n$, a plurality of linear thermal limit circuits $102_1$-$102_n$, a plurality of gate impedances $16_1$-$16_n$, and a plurality of Oring diodes $17_1$-$17_n$. The configuration of power FET network 100 is similar to that of power FET network 10 described with reference to FIG. 1. However, linear thermal limit circuit $102_1$-$102_n$ of power FET network 100 includes a thermal latch and an external multi-function control pin $104_1$-$104_n$, respectively, which allows the user to select an operating mode of power FET network 100. In accordance with an embodiment of the present invention, linear thermal limit circuits $102_1$-$102_n$ include the thermal latch (described with reference to FIG. 5) which is coupled to external multi-function control pin 104. Because of these differences the linear thermal limit circuits and the power FET networks described with reference to FIGS. 4 and 5 are identified by reference numbers 102 and 100, respectively.

Figure 6:
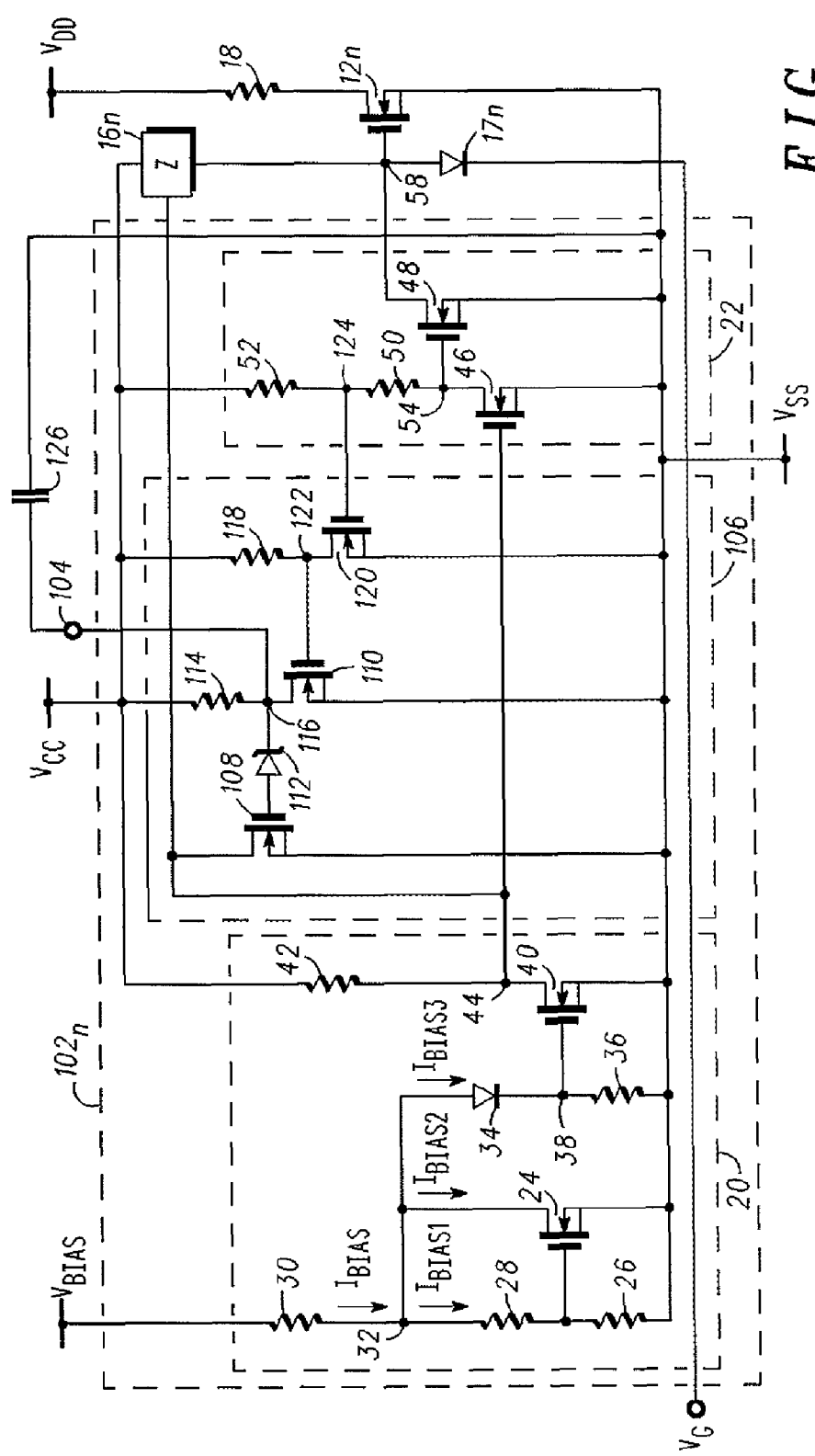
FIG. 6 is a circuit schematic of a power FET network in accordance with yet another embodiment of the present invention.

FIG. 6 illustrates a schematic diagram of power FET $12_n$ coupled to linear thermal limit circuit $102_n$ and gate impedance $16_n$. In accordance with an embodiment of the present invention, linear thermal limit circuit $16_n$ comprises a thermal sense circuit 20 coupled to a thermal latch 106 and to thermal amplifier 22. Like thermal sense circuit 20, thermal latch 106 is also coupled to thermal amplifier 22. Thermal sense circuit 20 and thermal amplifier 22 have been described with reference to FIG. 3. Output node 44 of thermal sense circuit 20 is connected to an input of thermal amplifier 22 as described with reference to FIG. 3. In addition, output node 44 is connected to an input terminal of thermal latch 106. Thermal latch 106 comprises an N-channel FET 108 coupled to an N-channel FET 110 through a Zener diode 112. The drain terminal of N-channel FET 108 is connected to output node 44, the source terminal of N-channel FET 108 is coupled for receiving source of operating potential $V_{SS}$, and the gate terminal of N-channel FET 108 is connected to the anode of Zener diode 112.

The drain terminal of N-channel FET 110 is coupled for receiving source of operating potential $V_{CC}$ through a resistor 114. The drain terminal is also connected to the cathode of Zener diode 112. The common connection of the drain terminal of N-channel FET 110, the anode of Zener diode 112, and one terminal of resistor 114, forms a node 116. Multi-function control pin 104 is connected to node 116. The gate terminal of N-channel FET 110 is commonly connected to one terminal of a resistor 118 and to the drain terminal of an N-channel FET 120 to form a node 122. The other terminal of resistor 118 is coupled for receiving source of operating potential $V_{CC}$. The source terminal of N-channel FET 120 is coupled for receiving source of operating potential $V_{SS}$ and the gate terminal of N-channel FET 120 is commonly connected to resistors 50 and 52 to form a node 124, which node serves as another input of thermal amplifier 22.

In operation, multi-function control pin 104 of thermal latch 106 is a multi-function pin that permits operating power FET network 100 in one of three operating modes. For the sake of convenience, the operational description of power FET network 100 will refer to FIGS. 5 and 6 together. In a first operating mode, multi-function control pin 104 is coupled to source of operating potential $V_{SS}$ using, for example, a shorting wire. In this mode, latch 106 is disabled and power FET network 100 operates like power FET network 10. In a second operating mode, multi-function control pin 104 is left floating or open, thermal latch 106 latches power FET network 100 into an off-state, i.e., power FET network 100 is turned off. In a third operating mode, a capacitor 126 is coupled between multi-function control pin 104 and source of operating potential $V_{SS}$. In this operating mode, thermal latch 106 latches power FET network 100 into an off-state after a fixed time delay set by the Resistance-Capacitance (RC) time constant of capacitor 126 and the resistor 114.

In the first operating mode, multi-function control pin 104 is coupled for receiving source of operating potential $V_{SS}$ and the potential appearing at node 116 is $V_{SS}$, e.g., ground. In this configuration, nodes 44 and 122 become high impedance nodes, thus power FET network 100 operates similarly to power FET network 10.

In the second operating mode multi-function control pin 104 is left floating and the temperature sensed by temperature sensing diode 34 is less than the predetermined value, node 44 is at a high voltage, and N-channel FET 46 is "on" and conducting current. Thus, node 124 is at a low voltage, N-channel FET 120 is "off" or in a non-conducting state, node 122 is at a high voltage level, and N-channel FET 110 is "on" and conducting current. Because N-channel FET 110 is "on," its drain terminal is at a low voltage level and the drain terminal of N-channel FET 108 is in a high impedance state. In this state, power FET network 100 operates similarly to power FET network 10. When the temperature sensed by temperature sensing diode 34 reaches the predetermined value, N-channel FET 46 conducts less current which increases the voltage at node 124 and turns on N-channel FET 120, resulting in N-channel FET 110 turning off and N-channel FET 108 turning on. This lowers the voltage at node 44, hence the voltage at the gate of N-channel FET 46, which turns off switching power FET $12_n$. Switching power FET $12_n$ is turned back on when the temperature sensed by temperature sensing diode 34 falls below the predetermined value, thereby turning off transistor 40 and placing a high voltage level at node 44 which is amplified by thermal amplifier 22 and turns on power switching FET $12_n$.

In the third operating mode in which capacitor 126 is coupled between multi-function control pin 104 and source of operating potential $V_{SS}$, when the temperature sensed by temperature sensing diode 34 is less than the predetermined value, the power FET network operates in a similar fashion as described for the second operating mode when the temperature is less than the predetermined value. When the temperature reaches the predetermined value, the circuit operates in a similar fashion as that described for the second operating mode, except that power FET network 100 is not switched off until a delay determined by the RC time constant of resistor 114 and capacitor 126.

Figure 7:
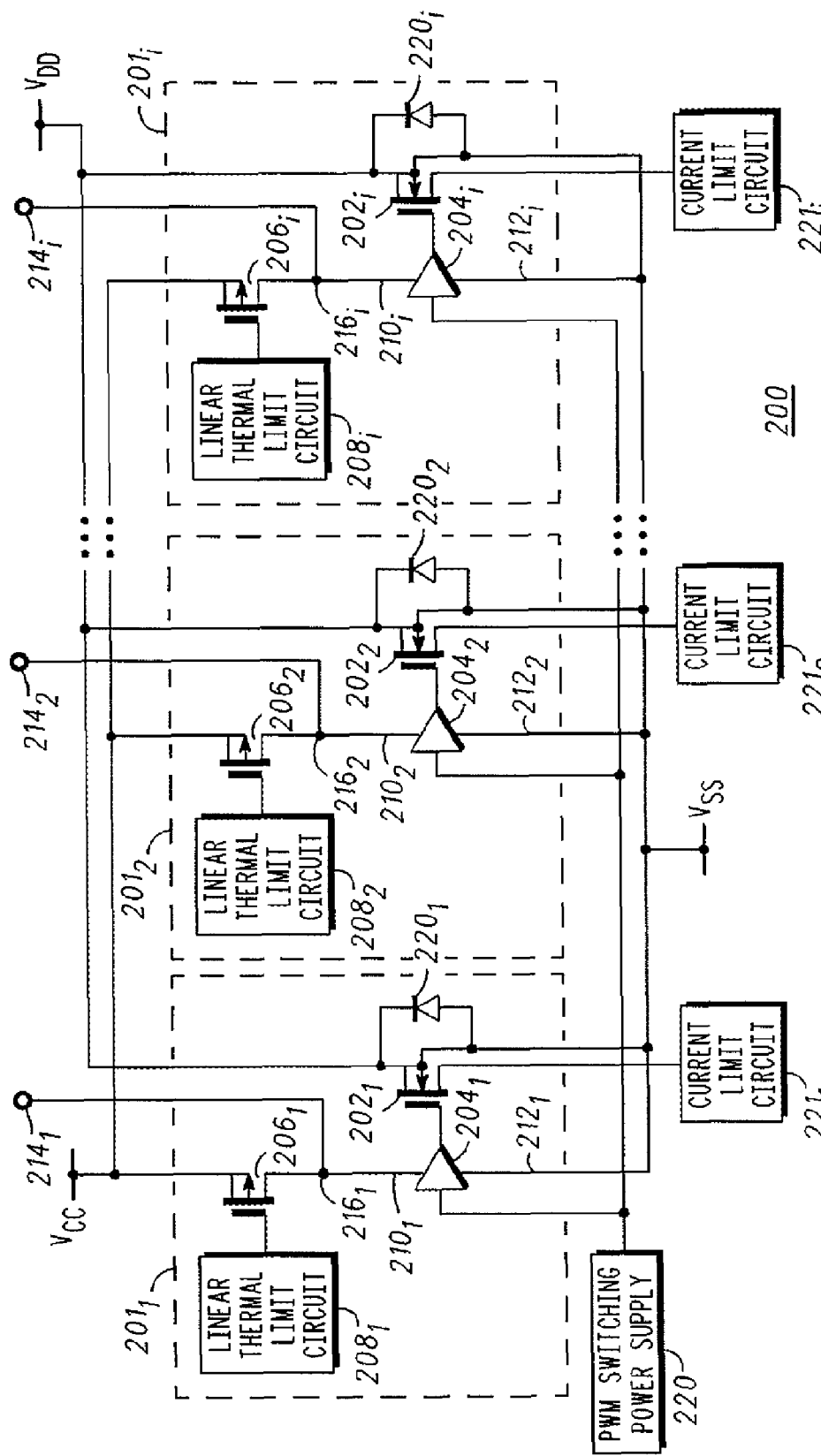
FIG. 7 is a circuit schematic of a power FET network in accordance with yet another embodiment of the present invention.

FIG. 7 is a circuit diagram of a power FET network 200 comprising a plurality of power FET sub-networks $201_i$ coupled together, where "i" is an integer equal to 1, 2, 3, . . . . Thus, the number of power FET sub-networks $201_i$ that are coupled together is not a limitation of the present invention. More particularly, FIG. 7 illustrates a power FET sub-network $201_2$ coupled to a power FET sub-network $201_1$ and a power FET sub-network $201_i$ coupled to power FET sub-network $201_2$. Each power FET sub-network $201_i$ comprises a power FET $202_i$, a drive circuit $204_i$, a regulator FET $206_i$, a linear thermal sense circuit $208_i$, and a current limit circuit $221_i$. Preferably, power FETs $202_i$ are N-channel FETs and regulator FETs $206_i$ are P-channel FETs. Thus, power FET sub-network $202_1$ comprises linear thermal limit circuit $208_1$ having an output terminal coupled to a gate terminal of regulator FET $206_1$. Regulator FET $206_1$ has a source terminal coupled to its body and coupled for receiving source of operating potential $V_{CC}$ and a drain terminal connected to upper supply rail terminal $210_1$ of drive circuit $204_1$ forming a node $216_1$. Node $216_1$ is connected to a bypass pin or terminal $214_1$. Drive circuit $204_1$ also has a lower supply rail terminal $212_1$ coupled for receiving source of operating potential $V_{SS}$ and an input terminal coupled to the output terminal of a pulse width modulation switching power supply 220. An output terminal of drive circuit $204_1$ is connected to the gate terminal of power FET $202_1$.

In accordance with one embodiment power FET $202_1$ is a sense FET that has a source terminal coupled to its body and for receiving source of operating potential $V_{SS}$, and a sense terminal coupled to a current limit circuit $221_1$. A drain terminal of power FET $202_1$ is coupled for receiving a source of operating potential $V_{DD}$. A body diode $220_1$ of power FET $202_1$ has an anode coupled to the source terminal of power FET $202_1$ and a cathode coupled to the drain terminal of power FET $202_1$. Power FET $202_1$ may be a FET with a current sensing resistor or the like.

Power FET sub-network $201_2$ comprises a linear thermal limit circuit $208_2$ having an output coupled to a gate terminal of regulator FET $206_2$. Regulator FET $206_2$ has a source terminal coupled to its body and coupled for receiving source of operating potential $V_{CC}$ and a drain terminal connected to upper supply rail terminal $210_2$ of drive circuit $204_2$ and to a bypass pin $214_2$ at a node $216_2$. Drive circuit $204_2$ also has a lower supply rail terminal $212_2$ coupled for receiving source of operating potential $V_{SS}$ and an input terminal coupled to the output terminal of a pulse width modulation switching power supply 220. An output terminal of drive circuit $204_2$ is connected to the gate terminal of power FET $202_2$.

Power FET $202_2$ is a sense FET that has a source terminal coupled to its body and for receiving source of operating potential $V_{SS}$, and a sense terminal coupled to a current limit circuit $221_2$. A drain terminal of power FET $202_2$ is coupled for receiving source of operating potential $V_{DD}$. A body diode $220_2$ of power FET $202_2$ has an anode coupled to the source terminal of power FET $202_2$ and a cathode coupled to the drain terminal of power FET $202_2$. The drain terminal of power FET $202_2$ is connected to the drain terminal of power FET $202_1$ and the source terminal of power FET $202_2$ is connected to the source terminal of power FET $202_1$. Like Power FET $202_1$, power FET $202_2$ may be a FET with a current sensing resistor or the like.

Power FET sub-network $201_i$ comprises a linear thermal limit circuit $208_i$ having an output coupled to a gate terminal of regulator FET $206_i$. Regulator FET $206_i$ has a source terminal coupled to its body and coupled for receiving source of operating potential $V_{CC}$ and a drain terminal connected to upper supply rail terminal $210_i$ of drive circuit $204_i$ and to a bypass pin $214_i$ at a node $216_i$. Drive circuit $204_i$ also has a lower supply rail terminal $212_i$ coupled for receiving source of operating potential $V_{SS}$ and an input terminal coupled to the output terminal of a pulse width modulation switching power supply 220. An output terminal of drive circuit $204_i$ is connected to the gate terminal of power FET $202_i$.

Power FET $202_i$ is a sense FET that has a source terminal coupled to its body and for receiving source of operating potential $V_{SS}$, and a sense terminal coupled to a current limit circuit $221_i$. A drain terminal of power FET $202_i$ is coupled for receiving a source of operating potential $V_{DD}$. A body diode $220_i$ of power FET $202_i$ has an anode coupled to the source terminal of power FET $202_2$ and a cathode coupled to the drain terminal of power FET $202_i$. The drain terminal of power FET $202_i$ is connected to the drain terminal of power FET $202_2$ and the source terminal of power FET $202_i$ is connected to the source terminal of power FET $202_2$. Like Power FETs $202_1$ and $202_2$, power FET $202_i$ may be a FET with a current sensing resistor or the like.

By way of example, $V_{DD}$ ranges from about 20 volts to about 600 volts, $V_{SS}$ is set at ground potential, and $V_{CC}$ ranges from about 1 volt to about 15 volts.

In operation, linear thermal limit circuits $208_1$-$208_i$ monitor the temperatures in the substrate material adjacent to or containing power FETs $202_1$-$202_i$, respectively. When the temperatures of the semiconductor substrate near power FETs $202_1$-$202_i$ remain below a predetermined value, linear thermal limit circuits $208_1$-$208_i$ apply the full gate voltage to power FETs $202_1$-$202_i$, respectively. Thus, the voltages appearing at nodes $216_1$-$216_i$ are substantially equal to $V_{CC}$ and provide the full operating power for the respective drive circuits $204_1$-$204_i$, i.e., the operating power appearing at upper supply rail terminals $210_1$-$210_i$ is substantially equal to the voltage $V_{CC}$. The inputs of drive circuits $204_1$-$204_i$ are coupled for receiving a pulse width modulation signal from, for example, a switching power supply 220. In accordance with one embodiment, the input signal appearing at the input terminals of drive circuits $204_1$-$204_i$ is a square wave having an amplitude ranging from about 5 volts to about 10 volts. The type of input signal and its amplitude and frequency are not limitations of the present invention. Because the bias signal received at upper supply rail terminal $210_1$-$210_i$ is substantially equal to operating potential $V_{CC}$, drive circuits $204_1$-$204_i$ are fully biased and their output signals are substantially at their full amplitudes.

If the temperature of one or more of the power FETs reaches the predetermined value or level, the linear thermal limit circuit associated with that power FET decreases the gate voltage of the regulator FET thereby increasing the on-resistance of the regulator FET. This increases the voltage drop across the regulator FET which reduces the voltage appearing at the corresponding node $216_i$ associated with the regulator FET which in turn lowers the bias voltage applied at upper supply rail terminal $210_i$. Reducing the bias voltage of the drive circuit $204_i$ decreases the amplitude of the output signal appearing at the gate terminal of power FET $202_i$, which lowers the current flowing through the power FET $202_i$. For example, if the temperature of the semiconductor substrate adjacent power FET $202_2$ reaches the predetermined value, linear thermal limit circuit $208_2$ decreases the voltage appearing at the gate terminal of power FET $202_2$. which increases the on-resistance of power FET $202_2$ and decreases the current flowing through power FET $202_2$. Operating at the lower current level lowers the temperature generated by power FET $202_2$. The increased on-resistance channels current away from power FET $202_2$ and toward power FETs $202_1$ and $202_i$. Thus, the current flowing through power FET $202_2$ is reduced independently of the current flowing through power FETs $202_1$-$202_i$.

Once the temperature of the semiconductor substrate containing power FET $202_2$ falls below the predetermined value, linear thermal limit circuit $208_2$ raises the voltage at the gate of power FET $202_2$ thereby increasing current conduction through it. The power dissipated by power FET $202_2$ remains substantially constant.

By now it should be appreciated that circuitry and methods have been provided for performing thermal management in an integrated circuit. Unlike other thermal management solutions that perform thermal management by shutting down or turning off a semiconductor component, the present invention accomplishes thermal management by maintaining a substantially constant temperature while the semiconductor devices remain operational. In accordance with one aspect the present invention allows paralleling multiple semiconductor devices without the addition of expensive and complicated circuitry and interconnects. This lowers the cost of manufacturing the integrated circuit and improves its reliability. Another advantage of the present invention is that it allows the integrated circuit to continue operating while the thermal management portion reduces the temperature of the substrate from which the semiconductor devices are formed. What is more, current derating is not necessary because fewer parallel configured devices are used. Using fewer parallel configured devices lowers costs and improves performance. In accordance with another aspect, the present invention includes a multi-functional control pin that allows operating the device in one of three different modes. This increases the functionality of the integrated circuit.

Although certain preferred embodiments and methods have been disclosed herein, it will be apparent from the foregoing disclosure to those skilled in the art that variations and modifications of such embodiments and methods may be made without departing from the spirit and scope of the invention. For example, the power N-channel FETs may be sense FETs or the like. It is intended that the invention shall be limited only to the extent required by the appended claims and the rules and principles of applicable law.

What is claimed is:

1. A method for regulating temperature in a first semiconductor device, comprising:

sensing temperature in a substrate near the first semiconductor device; and reducing a current flowing in the first semiconductor device from a first level to a second level in response to the temperature sensed in the portion of the first semiconductor device reaching a predetermined value, wherein in response to reducing the current flowing in the first semiconductor device a current flowing in a second semiconductor device increases, and wherein the first and second semiconductor devices each have first and second current carrying terminals, the first current carrying terminals of the first and second semiconductor devices commonly coupled together and the second current carrying terminals of the first and second semiconductor devices commonly coupled together.

2. The method of claim 1, wherein reducing the current flowing in the first semiconductor device includes reducing a gate voltage of the first semiconductor device.

3. The method of claim 1, further including using a thermal limit circuit having a thermal sense element to sense the temperature.

4. A method for regulating temperature in a first semiconductor device, comprising:

sensing temperature in a substrate near the first semiconductor device; and reducing a current flowing in the first semiconductor device from a first level to a second level in response to the temperature sensed in the portion of the first semiconductor device reaching a predetermined value, wherein reducing the current flowing in the first semiconductor device increases a current flowing in a second semiconductor device, wherein the first and second semiconductor devices each have first and second current carrying terminals, the first current carrying terminals of the first and second semiconductor devices commonly coupled together and the second current carrying terminals of the first and second semiconductor devices commonly coupled together.

5. The method of claim 4, wherein reducing the current flowing in the first semiconductor device includes reducing the conductance of the first semiconductor device.

6. A method for regulating temperature in a first semiconductor device, comprising:

sensing temperature in a substrate near the first semiconductor device; and reducing a current flowing in the first semiconductor device from a first level to a second level when the temperature sensed in the portion of the first semiconductor device reaches a predetermined value, wherein reducing the current flowing in the first semiconductor device includes sharing the current among a plurality of semiconductor devices, and wherein at least one of the semiconductor devices of the plurality of semiconductor devices and the first semiconductor device each have first and second current carrying electrodes, the first current carrying terminal of the first semiconductor device and the first current carrying terminal of the at least one semiconductor device commonly coupled together and the second current carrying electrode of the first semiconductor device and the second current carrying electrode of the at least one semiconductor device of the plurality of semiconductor devices commonly coupled together.

7. The method of claim 6, further including using a thermal limit circuit having a thermal sense element to sense the temperature.

8. A method for protecting a semiconductor chip from thermally induced damage, comprising:
sensing a temperature in a portion of the semiconductor chip; and
selecting an operating mode for the semiconductor chip using an external pin, wherein the operating mode is selected from the group of operating modes comprising latching a first semiconductor device into an off-state, latching the first semiconductor device into an off-state after a delay, and reducing a current flowing in the first semiconductor device from a first level to a second level.

9. The method of claim 8, wherein reducing the current flowing in the first semiconductor device comprises sharing the current between a plurality of semiconductor devices formed from the semiconductor chip.

10. The method of claim 8, further including providing a plurality of semiconductor devices coupled in parallel wherein the first semiconductor device is a semiconductor device of the plurality of semiconductor devices and wherein reducing the current flowing in the first semiconductor device includes reducing the current flowing in the first semiconductor device independently of other semiconductor devices of the plurality of semiconductor devices.

11. The method of claim 8, further including providing a plurality of semiconductor devices coupled in parallel wherein the first semiconductor device is a semiconductor device of the plurality of semiconductor devices and wherein reducing the current flowing in the first semiconductor device includes maintaining a substantially constant power dissipation from the first semiconductor device.

12. The method of claim 8, further including providing a plurality of semiconductor devices coupled in parallel, wherein the first semiconductor device is a semiconductor device of the plurality of semiconductor devices and wherein the current flowing in each of the plurality of semiconductor devices is at a first level, and wherein reducing the current flowing in the first semiconductor device includes reducing the current flowing in the first semiconductor device of the plurality of semiconductor devices to a second level while maintaining the first semiconductor device in an active operational mode, and further including increasing the current flowing in the first semiconductor device to substantially the first level when the temperature falls below a predetermined level.

13. A method for protecting an integrated circuit from thermally induced damage, comprising:
sensing a temperature in a portion of the integrated circuit; and
in response to the temperature sensed, operating the integrated circuit in an operating mode selected from the group of operating modes comprising latching a semiconductor device into an off state, latching the semiconductor device into the off-state after a predetermined delay, and operating the integrated circuit with a reduced current flowing in a portion of the integrated circuit to maintain the temperature of the portion of the integrated circuit substantially at or below a predetermined level.

14. The method of claim 13, wherein latching the semiconductor device into the off-state includes using a Resistance-Capacitance (RC) time constant to set the predetermined delay.

15. The method of claim 13, further including using a thermal limit circuit having a thermal sense element to sense the temperature.

16. The method of claim 15, further including operating the thermal limit circuit at a substantially constant temperature when that temperature is reached.

17. The method of claim 13, wherein operating in the operating mode of operating the integrated circuit with the reduced current flowing in the portion of the integrated circuit to maintain the temperature of the portion of the integrated circuit substantially at or below the predetermined level further includes reducing the current flowing in the integrated circuit from a first level to a second level when the temperature sensed in the portion of the integrated circuit reaches a predetermined value.

18. The method of claim 13, further including increasing another current flowing in another portion of the integrated circuit.

19. A method for regulating temperature in a first semiconductor device, comprising:
sensing temperature in a substrate near the first semiconductor device using a thermal limit circuit;
reducing a current flowing in the first semiconductor device from a first level to a second level and increasing a current flowing in a second semiconductor device in response to the temperature sensed in the portion of the first semiconductor device reaching a predetermined value, wherein the first and second semiconductor devices are coupled in a parallel configuration; and
operating the thermal limit circuit at a substantially constant temperature when that temperature is reached.

20. A method for regulating temperature in a first semiconductor device, comprising:
sensing temperature in a substrate near the first semiconductor device using a thermal limit circuit having a thermal sense element; and
reducing a current flowing in the first semiconductor device from a first level to a second level in response to the temperature sensed in the portion of the first semiconductor device reaching a predetermined value, wherein in response to reducing the current flowing in the first semiconductor device a current flowing in a second semiconductor device increases, and wherein the first and second semiconductor devices are coupled in a parallel configuration; and further including operating the thermal limit circuit at a substantially constant temperature when that temperature is reached.

21. A method for regulating temperature in a first semiconductor device, comprising:
sensing temperature in a substrate near the first semiconductor device using a thermal limit circuit having a thermal sense element;
reducing a current flowing in the first semiconductor device from a first level to a second level when the temperature sensed in the portion of the first semiconductor device reaches a predetermined value, wherein reducing the current flowing in the first semiconductor device includes sharing the current among a plurality of semiconductor devices; and further including operating the thermal limit circuit at a substantially constant temperature when that temperature is reached.

* * * * *